US006621708B1

(12) United States Patent
Sparkes et al.

(10) Patent No.: US 6,621,708 B1
(45) Date of Patent: Sep. 16, 2003

(54) ELECTRONICS ASSEMBLY INCLUDING A PROTECTIVE SHIELD

(75) Inventors: Stephen David Sparkes, Farnborough (GB); Gary Simon Rumney, Leighton Buzzard (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,531

(22) Filed: Jun. 10, 2002

(51) Int. Cl.[7] .............................. H05K 5/02; H05K 7/18
(52) U.S. Cl. ...................... 361/752; 361/796; 361/800; 174/35 GC
(58) Field of Search ................................. 361/752, 796, 361/800, 816, 818, 797; 174/35 R, 35 GC

(56) References Cited

U.S. PATENT DOCUMENTS

| | | | | |
|---|---|---|---|---|
| 5,838,551 A | * | 11/1998 | Chan | 361/818 |
| 5,864,088 A | * | 1/1999 | Sato et al. | 174/35 MS |
| 5,944,199 A | * | 8/1999 | Corisis et al. | 211/41.17 |
| 6,031,733 A | * | 2/2000 | Corisis et al. | 361/825 |
| 6,138,347 A | * | 10/2000 | Persson et al. | 29/836 |
| 6,191,928 B1 | * | 2/2001 | Rector et al. | 361/127 |
| 6,324,075 B1 | * | 11/2001 | Unrein et al. | 361/816 |
| 2002/0012461 A1 | * | 1/2002 | Yazaki | 361/752 |

* cited by examiner

*Primary Examiner*—David Martin
*Assistant Examiner*—Dameon E. Levi
(74) *Attorney, Agent, or Firm*—Meyertons Hood Kivlin Kowert & Goetzel, P.C.; B. Noël Kivlin

(57) ABSTRACT

An electronics assembly comprises:
  (i) a frame (1);
  (ii) a motherboard (16) that is located within the frame; and
  (iii) one or more daughterboards (20) that extend in a plane generally perpendicular to the plane of the motherboard.

The motherboard has a protective shield (40, 52) that extends over the major surface of the motherboard that is oriented toward the or each daughterboard. The shield has one or more apertures (54) therein to allow electrical connection between the motherboard and the or each daughterboard.

13 Claims, 4 Drawing Sheets

US 6,621,708 B1

ELECTRONICS ASSEMBLY INCLUDING A PROTECTIVE SHIELD

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting frame that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it.

In such assemblies, the motherboard may need to be removed for general maintenance purposes, upgrading or the like and so the frame of the assembly will normally provide for removal of the motherboard therefrom and re-insertion therein.

One problem that can be encountered during servicing and maintenance of the assembly during operation thereof is that certain components, especially certain power components located on the motherboard can be subjected to relatively high voltages for electronics systems, for example 48 V d.c. which, although not dangerous to health, can cause minor shocks.

SUMMARY OF THE INVENTION

According to one aspect, the present invention provides an electronics assembly which comprises:
(i) a frame;
(ii) a motherboard that is located within the frame; and
(iii) one or more daughterboards that extend in a plane generally perpendicular to the plane of the motherboard;
wherein the motherboard has a protective shield that extends over the major surface thereof that is oriented toward the or each daughterboard and which has an aperture therein to allow electrical connection between the motherboard and the or each daughterboard.

The assembly according to the invention may be one in which the motherboard is arranged in a substantially horizontal plane beneath a number of daughterboards located in parallel, vertical planes above the motherboard. This assembly is intended, as far as possible, to be in continuous operation, and may be designed so that one or more daughterboards can be removed and replaced, for example for repair or for maintenance purposes, while the system as a whole is still operating.

The fact that the motherboard is arranged in a horizontal plane in this embodiment, and can be located directly beneath locations where certain operations will be performed, such as ejection and removal of the daughterboards, and replacement thereof, can mean that small foreign bodies, for example, screws, clips, nuts and bolts, can be inadvertently dropped between the cords forming the daughterboards and onto the motherboard. This can lead to short circuits between various components and failure of the system. According to the present invention however, the motherboard is protected from the effect of any such objects by the protective shield. In addition, any danger of someone inadvertently touching live parts of the circuit is removed or reduced.

The protective shield may, in many instances, form part of a protective housing that extends over both major surfaces of the motherboard, and may also extend around each edge of the motherboard. Such a protective housing may thus enclose the motherboard substantially entirely other than any electrical connectors thereon. Where the protective shield forms part of a housing that extends around the motherboard, the invention has the advantage that it can be removed from the electronics assembly and can be subjected to dirty environments without risk to the performance thereof. Indeed, the protective shield and any housing that includes the shield may be formed from metal, for example the same metal forming the rest of the chassis of the assembly such as aluminium zinc plated steel, and therefore be relatively robust.

Where the protective shield is formed from a metal it will be necessary to isolate the motherboard from the shield, for example by providing one or more spacing elements that will physically separate the motherboard from the protective shield.

Such electronics assemblies are normally made so that the motherboard can itself be removed for repair or maintenance purposes, and the shield can be provided with location elements for locating the motherboard correctly with respect to the frame forming the chassis or a part of the chassis of the assembly. Typically such locating elements would comprise screws or bolts that screw into the frame if the motherboard is to be fixed in that way, or guidance and location elements such as pins and corresponding recesses may be employed where the motherboard housing is intended to be slid into place in the frame. It is also possible for the protective shield, especially when forming part of a housing, to be provided with guidance and location elements to enable it to be located correctly, with respect to guides for the daughterboards rather than with respect to the frame as a whole.

According to another aspect, the invention provides an electronics assembly which comprises:
(i) a frame;
(ii) a motherboard that is located within the frame; and
(iii) one or more daughterboards that extend in a plane generally perpendicular to the plane of the motherboard;
wherein the motherboard is arranged in a substantially horizontal plane beneath a protective shield that extends over the upper surface of the motherboard.

According to a further aspect, the invention provides a frame for an electronics assembly, which comprises:
(i) a motherboard that is located within the frame; and
(ii) a location for receiving at least one daughterboard so that it extends in a plane generally perpendicular to the motherboard;
wherein the motherboard has a protective shield that extends over the major surface thereof that is oriented toward the or each daughterboard and which has an aperture therein to allow electrical connection between the motherboard and the or each daughterboard.

Such a motherboard may be permanently secured within the frame or it may be removable therefrom as described above. Where the motherboard is removable from the frame, the shield may remain in place within the chassis during removal of the motherboard since it is not essential in such a circumstance to protect the motherboard from foreign bodies. Thus, according to yet another aspect, the invention provides a frame for an electronics assembly, which comprises:

(i) a first location for receiving a planar motherboard;

(ii) a second location for receiving at least one daughterboard so that it extends in a direction substantially perpendicular to the motherboard; and (iii) a protective shield for the motherboard that extends in a plane substantially parallel to the plane of the motherboard and is located between the first location for receiving the motherboard and the second location for receiving the or each daughterboard.

In this case, the protective shield could be a plate-like structure that is arranged above the location in the frame for receiving the motherboard. The protective shield could, however, form part of a protective housing that surrounds the motherboard, provided that the motherboard can be removed therefrom when it is to be removed from the frame as a whole. Thus, for example, the protective housing could have a removable proximal surface which, when removed, will expose an opening for removal of the motherboard.

Where the protective shield is removable from the frame of the assembly together with the motherboard, the combination thereof with the motherboard is itself novel and so according to yet a further aspect, the invention provides a circuit board assembly for an electronics system, which comprises a planar printed circuit board having at least one electrical connector on a major surface thereof to allow the printed circuit board to be connected to one or more other printed circuit boards extending in a plane generally perpendicular to the plane thereof, and a protective shield that extends over the major surface, the shield having one or more apertures therein in register with the or each electrical connector.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
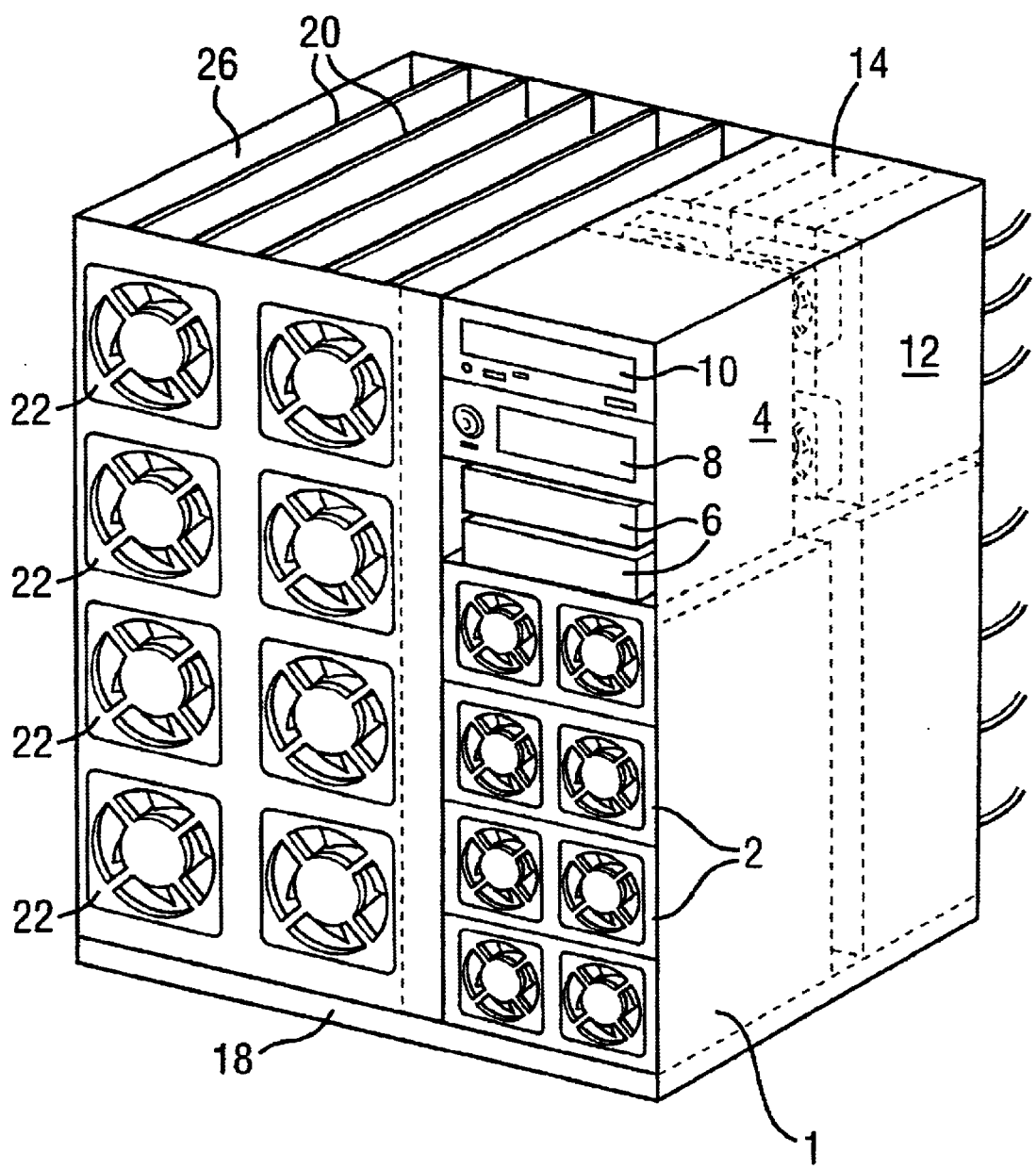
FIG. 1 is a schematic perspective view of an electronics assembly according to the invention.

Referring now to the drawings, in which like reference numerals are used to designate corresponding elements, FIG. 1 shows an assembly according to the invention that forms part of a server that may be employed for a number of services, for example as part of a local area network (LAN) and is designed as a nineteen inch rack to be located in an electronics cabinet.

The assembly comprises a frame 1 in which the various components are located. The frame 1 contains a number of power modules 2 for converting mains a.c. power to an appropriate d.c. voltage, a part 4 that contains hard disk drives 6, a tape drive 8 and a CD-ROM or digital video disc (digital versatile disc—DVD) drive 10, and a part 12 that contains a number of I/O cards 14. A motherboard 16 is located within the frame in a horizontal plane at the bottom of the frame in a tray-shaped holder 18, and a number of daughterboards 20 are arranged next to each other in a vertical plane above the motherboard 16 and to the side of the power modules 2. The daughterboards may serve any of a number of purposes, for example having CPUs or may be repeater boards etc. Finally, a number of fans 22 are provided in an array at the front of the frame in order to blow air through the assembly between the daughterboards 20 for cooling.

Figure 2:
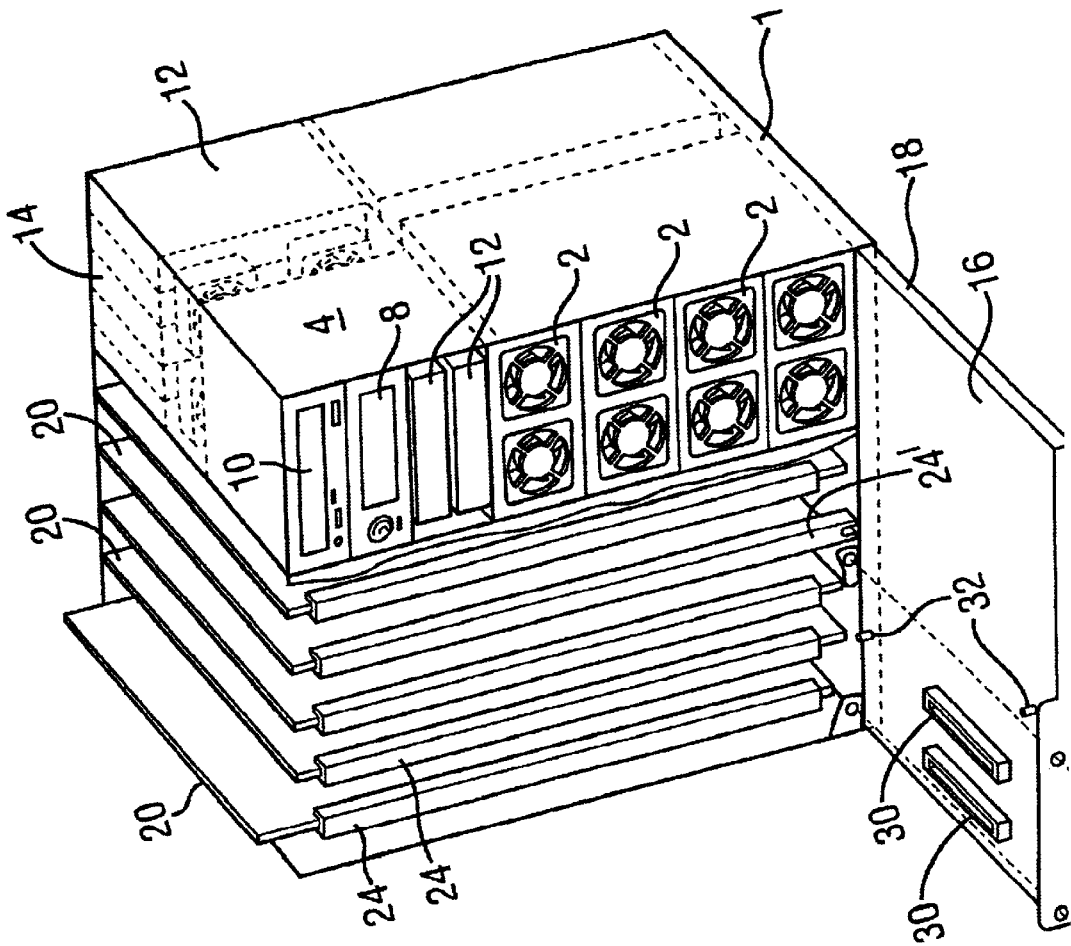
FIG. 2 is a schematic view corresponding to FIG. 1 but with the front of the assembly removed and the motherboard partly removed.

FIG. 2 shows the assembly with part of the front removed in order to expose the daughterboards 20, and with the motherboard module 18 partly removed. The daughterboards 20 are each located between a pair of elongate card guides 24 that extend normal to the plane of the motherboard 16 between the motherboard and openings 26 at the top surface of the frame 1 for insertion of the daughterboards. The card guides 24 terminate at their lower end some distance short of the motherboard in order to allow sufficient clearance for any components that are located on the motherboard to pass beneath the guides as the motherboard is removed from the frame. The card guides may be formed from metal, or from a suitable, relatively rigid, plastics material such as a polyamide, and have generally "U"-shaped cross-sections into which the edges of the daughterboards 20 can be slotted.

Any of the electronics components of the assembly may need to be removed and replaced from time to time, for example for repair or for upgrading, and in order to do this the daughterboards 20 can simply be lifted out of the frame through the openings 26. If the motherboard 16 needs attention, the daughterboards must first be removed, and then the motherboard may be removed by sliding it horizontally out of the frame 1 in its own plane after first removing screws 28. A new motherboard may then be inserted into the frame 1 and the daughterboards 20 re-inserted into frame along the card guides 24 into engagement with the motherboard via connectors 30 on the motherboard 16 and corresponding connectors (not shown) on the daughterboards.

Figure 3:
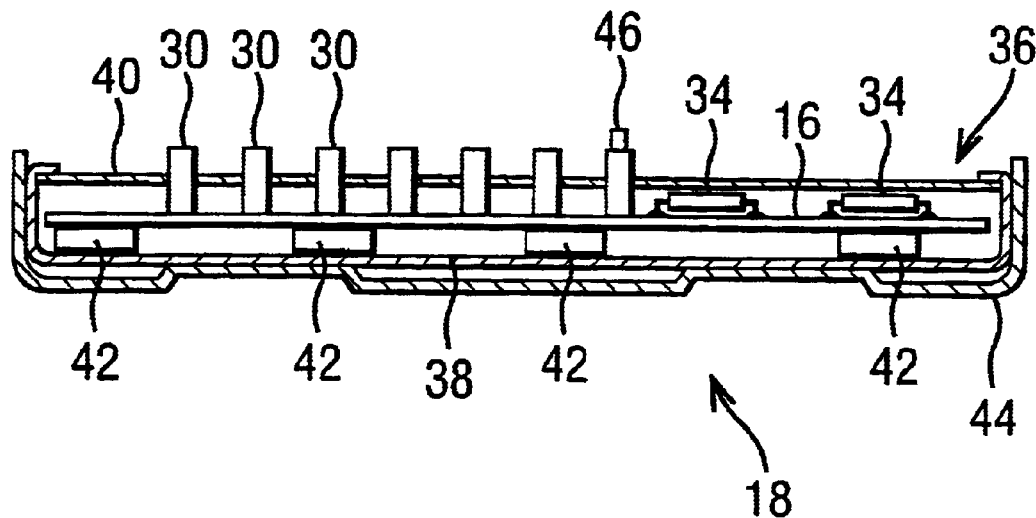
FIG. 3 is a cross-section through the module containing the motherboard.

A section through the holder 18 containing the motherboard is shown in FIG. 3. The holder assembly comprises the motherboard 16 on which are located various components such as integrated circuits 34 and a number, seven, for example, high density connectors 30 for forming connections with the daughterboards 20. The motherboard 16 is enclosed in a metal housing 36 formed from a base part 38 and a top cover 40 that is screwed to the base part. The motherboard 16 is supported on the base part 38 by means of insulating blocks 42 so that any conductive areas such as tracks, vias, solder joints etc. do not touch the metal housing, and the connectors 30 extend through closely fitting rectangular apertures in the top cover 40 of the housing. The entire module can be placed in a flat holder 44 that forms part of the chassis of the electronics assembly and which can be slid out of the frame 1 of the assembly when required. The holder can have guide elements (not shown) in order to enable it to be located correctly with respect to the frame 1 and to facilitate sliding of the holder into and out of the frame. The top cover 40 may be provided with location elements such as pins 46, only one of which is shown, that engage corresponding recesses in the card guides 24 for the daughterboards and enable the protective housing 36, and hence the motherboard 16, to be accurately located with respect to the daughterboards for connection thereto.

If the electronics assembly is serviced while live, one or more of the daughterboards 20 may be removed for repair or upgrading. Any foreign body such as a screw, nut etc. that is inadvertently dropped will simply land on the top cover 40 of the motherboard housing and will not affect operation thereof. In addition, it is impossible to touch any live components on the motherboard. If the motherboard itself needs to be removed, it will be protected from dirt that may be present in the environment by the housing 36 and the holder 44.

Figure 4:
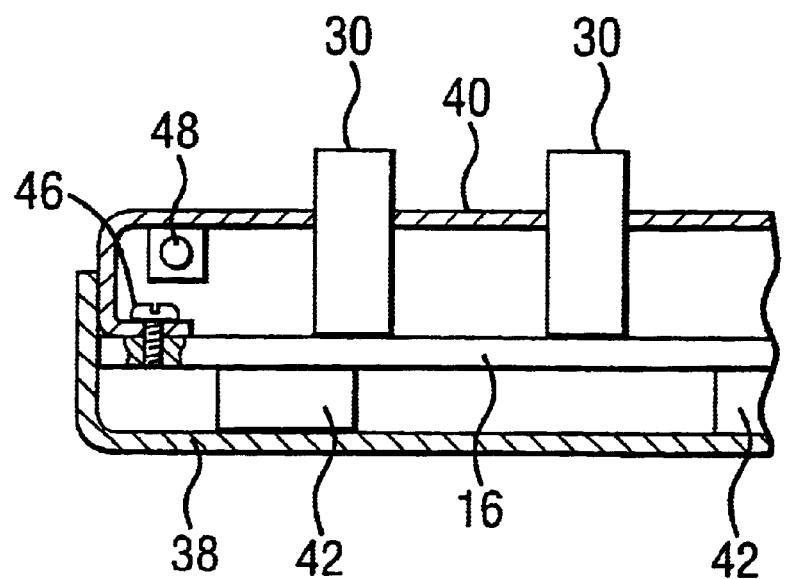
FIG. 4 is a cross-section through a modification of the module shown in FIG. 3 in an enlarged scale.

FIG. 4 shows part of a modification of the motherboard module of FIG. 3. In this modification the motherboard 16 is supported in a base part 38 of a protective housing by means of electrically insulating supports 42 as described with respect to FIG. 3, but the top cover 40 is mounted on the motherboard 16 itself and fixed to it by means of screws 46 that can be accessed by means of small holes (not shown) in the top cover 40. The top cover is also provided with L-com pins 48 at each side thereof that will mate with corresponding recesses in the frame, or may be provided with recesses that will engage L-com pins in the frame 1 in order to ensure correct alignment of the module with the frame. The module shown in FIG. 4 may be introduced directly into the frame on its own, or it may be placed in a holder 44 as shown in FIG. 3.

Figure 5:
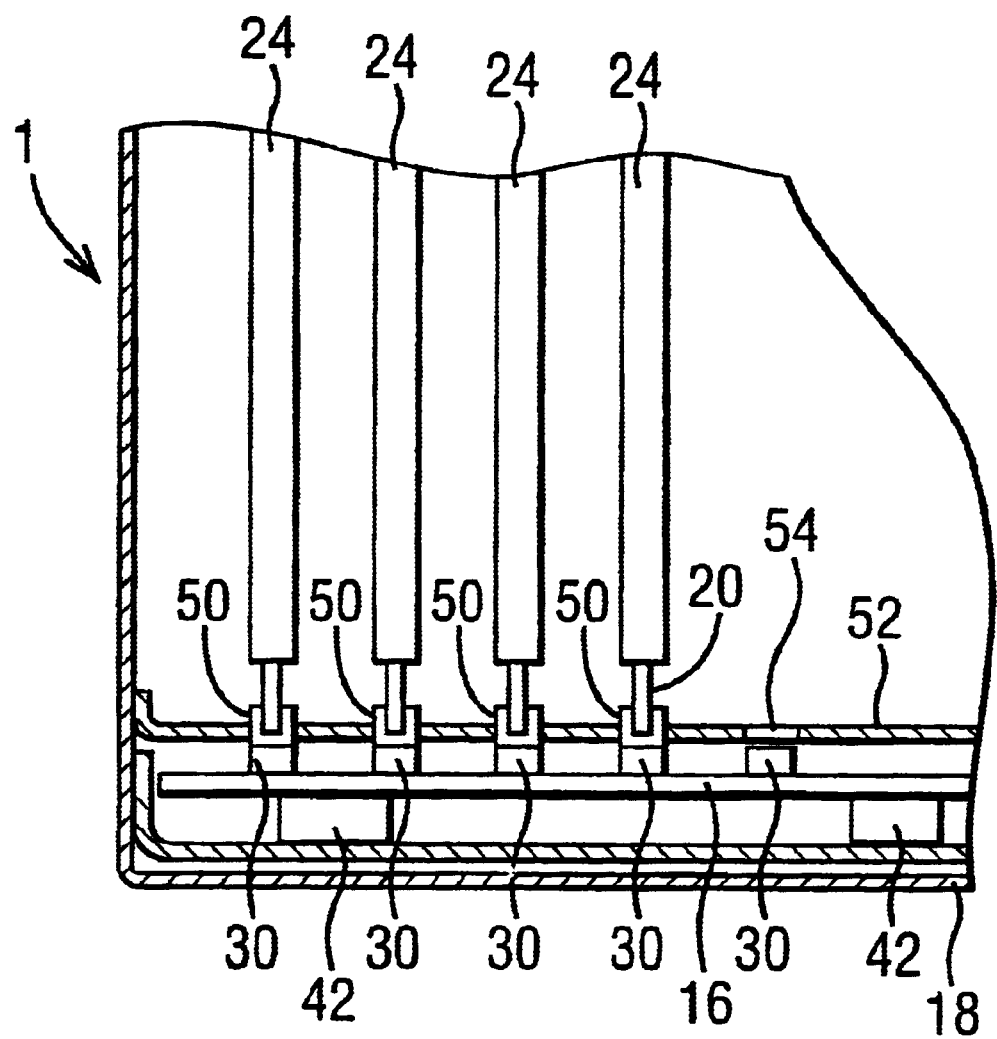
FIG. 5 is a section through part of an alternative form of assembly according to the invention.

FIG. 5 shows another form of electronics assembly according to the invention. This assembly comprises a frame 1 or chassis that has a horizontal location at the bottom thereof in which a motherboard 16 is located and is supported in a tray 18 that is slidable with respect to the frame for removal and replacement of the motherboard. A number of vertical card guides 24 are provided in the frame for supporting daughterboards 20 arranged in an array of vertical planes and in register with high density connectors 30 arranged on the motherboard 16 so that the daughterboards can be lowered into place with their connectors 50 mated with connectors 30 on the motherboard.

In the arrangement shown in FIG. 5, a horizontal plate 52 is located within the frame 1 and supported by the side walls thereof just above the motherboard 16. The plate 52 has a number of rectangular apertures 54 therein in register with the connectors 30 on the motherboard to allow the connectors 50 on the daughterboards to mate with those on the motherboard. The plate 52 is one or two millimeters higher than the top of the connectors 30 on the motherboard to allow the motherboard to be slid out of the frame (once all the daughterboards have been removed) for repair and replacement. Although the motherboard is not protected from the environment once it has been removed, it is protected from damage caused by foreign bodies when it is in place in the chassis.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises:
   (i) a frame;
   (ii) a motherboard that is located within the frame;
   (iii) one or more daughterboards that extend in a plane generally perpendicular to the plane of the motherboard;
   (iv) one or more connectors positioned to allow the one or more daughterboards to be manually engaged and disengaged with the motherboard;
   wherein the motherboard has a protective shield that extends over the major surface thereof that is oriented toward the one or more daughterboards and which has at least one aperture, wherein at least a portion of the one or more connectors extend into the at least one aperture; and
   wherein at least a portion of the protective shield is spaced apart from the motherboard.

2. An assembly as claimed in claim 1, wherein the protective shield forms part of a protective housing that extends over both major surfaces of the motherboard.

3. An assembly as claimed in claim 1, wherein the protective shield extends around each edge of the motherboard.

4. An assembly as claimed in claim 2, wherein the protective housing encloses the motherboard substantially entirely other than any connectors thereon.

5. An assembly as claimed in claim 1, wherein the protective shield is metallic and the motherboard is electrically isolated therefrom.

6. An assembly as claimed in claim 1, which includes on or more spacing elements that physically separate the motherboard from he protective shield.

7. An assembly as claimed in claim 1, wherein the protective shield has one or more location elements for locating the motherboard with respect to the frame.

8. An assembly as claimed in claim 1, wherein the motherboard is arranged in the frame in a substantially horizontal place.

9. An assembly as claimed in claim 8, wherein the motherboard is arranged in the frame underneath the one or more daughterboards.

10. A frame for an electronics assembly, which comprises:
    (i) a motherboard that is located within the frame;
    (ii) a location for receiving at least on daughterboard so that it extends in a plane generally perpendicular to the motherboard;
    (iii) one or more connectors positioned on the motherboard and configured to allow the at least one daughterboard to be manually engaged and disengaged with the motherboard;
    wherein the motherboard has a protective shield that extends over the major surface thereof that is oriented toward the at least one daughterboard and which has at least one aperture, wherein at least a portion of the one or more connectors extend into the at least one aperture; and
    wherein at least a portion of the protective shield is spaced apart from the motherboard.

11. A frame for an electronics assembly, which comprises:

(i) a first location for receiving a planar motherboard;

(ii) a second location for receiving at least on daughterboard so that it extends in a direction substantially perpendicular to the motherboard;

(iii) one or more connectors positioned on the motherboard and configured to allow the at least one daughterboard to be manually engaged and disengaged with the motherboard;

(iv) a protective shield for the motherboard that extends in a plane substantially parallel to the plane of the motherboard and is located between the first location for receiving the motherboard and the second location for receiving the at least one daughterboard, the protective shield having at least one aperture, wherein at least a portion of the one or more connectors extend into the at least one aperture; and wherein at least a portion of the protective shield is spaced apart from the motherboard.

12. A circuit board assembly for an electronics system, which comprises a planar printed circuit board having at least one connector on a major surface thereof to allow one or more other printed circuit boards extending in a plane generally perpendicular to the plane thereof; to be manually engaged and disengaged with the planar printed circuit board; and a protective shield that extends over the major surface, the protective shield having one or more apertures, wherein at least a portion of the at least one connector extends into the one or more apertures; and wherein at least a portion of the protective shield is spaced apart from the planar printed circuit board.

13. A circuit board assembly as claimed in claim 11, wherein the protective shield forms part of a protective housing that extends around substantially the entire printed circuit board.

\* \* \* \* \*

UNITED STATES PATENT AND TRADEMARK OFFICE
CERTIFICATE OF CORRECTION

PATENT NO. : 6,621,708 B1 Page 1 of 1
DATED : September 16, 2003
INVENTOR(S) : Sparkes et al.

It is certified that error appears in the above-identified patent and that said Letters Patent is hereby corrected as shown below:

Column 6,
Line 38, please change "on" to -- one --.
Line 40, please change "he" to -- the --.
Line 46, please change "place" to -- plane --.
Line 52, please change "on" to -- one --.

Column 7,
Line 3, please change "on" to -- one --.

Signed and Sealed this

Twenty-fourth Day of February, 2004

JON W. DUDAS
*Acting Director of the United States Patent and Trademark Office*